United States Patent [19]

Fan

[11] Patent Number: 6,022,809
[45] Date of Patent: Feb. 8, 2000

[54] COMPOSITE SHADOW RING FOR AN ETCH CHAMBER AND METHOD OF USING

[75] Inventor: Yuh-Da Fan, Tao-Wu Country, Taiwan

[73] Assignee: Taiwan Semiconductor Manufacturing Company, Ltd., Hsin-Chu, Taiwan

[21] Appl. No.: 09/205,040

[22] Filed: Dec. 3, 1998

[51] Int. Cl.[7] ............................ H01L 21/302; G03F 9/00; B28B 1/02
[52] U.S. Cl. ............................ 438/710; 216/12; 156/345; 430/24; 438/944
[58] Field of Search .................................. 438/944, 710; 216/12; 156/345; 430/24

[56] References Cited

U.S. PATENT DOCUMENTS

| | | | |
|---|---|---|---|
| 5,328,722 | 7/1994 | Ghanayem et al. | 427/250 |
| 5,354,382 | 10/1994 | Sung et al. | 118/723 MR |
| 5,356,515 | 10/1994 | Tahara et al. | 156/643 |
| 5,494,523 | 2/1996 | Steger et al. | 118/723 E |
| 5,695,831 | 12/1997 | Miyazaki | 427/576 |

FOREIGN PATENT DOCUMENTS 595054  5/1994  European Pat. Off. .

*Primary Examiner*—Benjamin Utech
*Assistant Examiner*—George Goudreau
*Attorney, Agent, or Firm*—Tung & Associates

[57] ABSTRACT

A composite shadow ring for use in an etch chamber that does not generate contaminating oxygen gas when bombarded by a gas plasma and a method for using such composite shadow ring are presented. The composite shadow ring may have a structure of a body portion of a ring shape that is made of a material that is substantially of silicon dioxide and an insert portion which is intimately joined to the body portion and is adjacent to a plasma cloud in the etch chamber when the shadow ring is positioned juxtaposed to the wafer, the insert portion of the shadow ring may also have a ring shape and is eccentric with the body portion, it generally has a diameter smaller than a diameter of the body portion, the insert portion may be fabricated of a material that does not generate oxygen when bombarded by a fluorine-containing gas plasma. The body portion may have a crosssection of a rectangle which has an upper inner corner of the rectangle missing to form a cavity for receiving an insert member intimately therein. The insert portion may further have a cross-section of a rectangle. The insert portion may be advantageously made of a material that is substantially silicon.

20 Claims, 2 Drawing Sheets

COMPOSITE SHADOW RING FOR AN ETCH CHAMBER AND METHOD OF USING

FIELD OF THE INVENTION

The present invention generally relates to a composite shadow ring for use in an etch chamber and more particularly, relates to a composite shadow ring for use in an etch chamber that employs fluorine chemistry wherein the ring does not generate contaminating oxygen gas when bombarded by the fluorine gas plasma.

BACKGROUND OF THE INVENTION

In the fabrication of modem integrated circuit devices, one of the key requirements is the ability to construct plugs or interconnects in reduced dimensions such that they may be used in a multi-level metalization structure. The numerous processing steps involved require the formation of via holes for the plug or interconnect in a dimension of 0.5 $\mu$m or less for use in high-density logic devices. For instance, in forming tungsten plugs by a chemical vapor deposition method, via holes in such small dimensions must be formed by etching through layers of oxide and spin-on-glass materials at a high etch rate. A high-density plasma etching process utilizing a fluorine chemistry is frequently used for such via formation process.

The via hole formation process can be enhanced by improving the etch directionality by a mechanism known as sidewall passivation to improve the anisotropy of the etching process. By utilizing a suitable etchant gas and reactor parameters, an etch-inhibiting film, normally of a polymeric nature, can be formed on vertical sidewalls. The etch-inhibiting film or the polymeric film slows down or completely stops any possible lateral etching of horizontal surfaces in the via hole. For instance, when a fluorine-containing etchant gas such as $CFH_3$ is used, a fluorine-type polymeric film is formed on the sidewalls. Many photoresist materials may also contribute to the formation of a polymeric film on the sidewalls. After the sidewall is coated with a polymeric film, it is protected by the inhibitor film to preserve the line width or via hole diameter control.

In a modem etch chamber, an electrostatic wafer holding device, i.e., an electrostatic chuck or E-chuck, is frequently used in which the chuck electrostatically attracts and holds a wafer that is positioned on top. The E-chuck holding method is highly desirable in the vacuum handling and processing of wafers. In contrast to a conventional method of holding wafers by mechanical clamping means where only slow movement is allowed during wafer handling, an E-chuck device can hold and move wafers with a force equivalent to several tens of Torr pressure. Another advantage for the E-chuck arrangement is that no particle generation or contamination problem can occur since there are no moving parts acting on the wafer. Moreover, the electrostatic force utilized on an E-chuck is sufficient to prevent bowing of a wafer which normally occurs in mechanical clamping and thus promotes uniform heat transfer over the entire wafer surface.

In an etch chamber equipped with a plasma generating device and an electrostatic chuck for holding a wafer, a shadow ring is utilized as a seal around the peripheral edge of the wafer. The shadow ring, sometimes known as a focus ring, is utilized for achieving a more uniform plasma distribution over the entire surface of the wafer and to help restrict the distribution of the plasma cloud to stay only on the wafer surface area. The uniform distribution function is further enhanced by a RF bias voltage applied on the wafer during a plasma etching process. Another function served by the shadow ring is sealing at the wafer level the upper compartment of the etch chamber which contains the plasma from the lower compartment of the etch chamber which contains various mechanical components for controlling the E-chuck. This is an important function since it prevents the plasma from attacking the hardware components contained in the lower compartment of the etch chamber. In order to survive the high temperature and the hostile environment, the shadow ring is frequently constructed of a ceramic material such as quartz.

In a method for forming tungsten plugs by CVD tungsten deposition, via holes through insulating layers deposited on a pre-processed silicon wafer must first be opened. For instance, when tungsten plugs are formed on logic devices, via holes through composite layers of plasma enhanced oxide/spin-on-glass/plasma enhanced oxide must first be provided. In forming via openings in an etch chamber equipped with a quartz shadow ring, a plug loss defect has frequently been observed on the wafer particularly at areas close to the peripheral edge of the wafer. The plug loss defect is caused by lateral etch in a via opening such that a desirable diameter of the via opening cannot be maintained. The cause of the problem has been diagnosed as an interaction between oxygen gas generated by the quartz shadow ring when the ring is attacked by a fluorine-containing plasma and the polymeric passivation film coated in the via holes. The oxygen gas generated by the quartz shadow ring attacks the polymeric passivation film such that the passivation film is lost and thus subjecting the spin-on-glass (SOG) layer exposed in the via hole to lateral etching by the fluorine-containing plasma. The over etching of the SOG layer in the horizontal direction leads to the plug loss defect which prevents the formation of tungsten plugs in the desirable dimension that was intended.

It is therefore an object of the present invention to provide a shadow ring for use in an etch chamber that does not have the drawbacks or shortcomings of the conventional shadow rings.

It is another object of the present invention to provide a shadow ring for use in an etch chamber that is made of a material which does not generate contaminating oxygen gas when attacked by a fluorine-containing plasma.

It is a further object of the present invention to provide a composite shadow ring for use in an etch chamber wherein the ring has a surface that can not be attacked by a fluorine-containing plasma and thus any possible release of oxygen gas to destroy polymeric passivation layers in via opening can be prevented.

It is another further object of the present invention to provide a composite shadow ring for use in an etch chamber that comprises a body portion and an insert portion which intimately joins the body portion and is made of a material not subjected to attack by a fluorine-containing plasma.

It is still another object of the present invention to provide a composite shadow ring for use in a fluorine-containing plasma environment such that the portion of the shadow ring that is immediately adjacent to a wafer surface is made of a material which is inert to the fluorine-containing plasma generated in the etch chamber.

It is yet another object of the present invention to provide a composite shadow ring for use in an etch chamber that comprises a body portion made of a quartz material and an insert portion intimately joined to the body portion and is situated immediately adjacent to a wafer surface made of a material that does not generate oxygen gas upon attack by a fluorine-containing plasma.

It is still another further object of the present invention to provide a vacuum chamber for etching an electronic substrate that is equipped with a shadow ring constructed of two different materials wherein the material that is immediately adjacent to the wafer surface does not produce oxygen gas when attacked by a fluorine-containing plasma.

It is yet another further object of the present invention to provide a method for etching an electronic substrate in an etch chamber by utilizing a shadow ring that is constructed of at least one material which does not generate oxygen gas when attacked by a fluorine-containing plasma when the at least one material is positioned immediately adjacent to a wafer surface.

SUMMARY OF THE INVENTION

In accordance with the present invention, a composite shadow ring that is used in an etch chamber which includes an insert portion made of a material that does not release oxygen gas when attacked by a fluorine-containing plasma so that plug loss defect on the wafer surface near the shadow ring does not occur is provided.

In a preferred embodiment, a composite shadow ring for use in an etch chamber that does not generate contaminating oxygen gas when bombarded by a gas plasma is provided which includes a body portion in a ring shape made of a material that is substantially silicon dioxide, and an insert portion intimately joined to the body portion and is juxtaposed to a plasma cloud in the etch chamber when the shadow ring is positioned on a wafer, the insert portion has a ring shape and is concentric with the body portion and generally has a diameter smaller than a diameter of the body portion, the insert portion is fabricated of a material that does not generate oxygen upon bombardment by the plasma cloud.

The insert portion of the shadow ring can be made of a material that is substantially silicon. The insert portion may have a cross-section of a rectangle. The body portion of the shadow ring generally has a cross-section of a rectangle with an upper inner corner of the rectangle missing and thus forming a cavity for the insert member to be intimately joined thereto. The body portion can be made of a high temperature resistant ceramic material, such as quartz. The insert portion is normally made of a material that does not generate oxygen when bombarded by a fluorine-containing plasma.

In another preferred embodiment, an etch chamber for a semiconductor wafer is provided which includes means for generating a plasma of an etchant gas, means for holding a semiconductor wafer securely on a platform, and a shadow ring for engaging an edge portion of the wafer and for forming a seal between an upper chamber and a lower chamber separated by the wafer, the shadow ring may further include a body portion in a ring shape formed of a material that is substantially silicon dioxide, and an insert portion that is intimately joined to the body portion and positioned juxtaposed to a plasma cloud in the etch chamber when the shadow ring is positioned on a wafer, the insert portion has a ring shape and is concentric with the body portion, the insert portion generally has a diameter smaller than a diameter of the body portion, the insert portion can be fabricated of a material that does not generate oxygen upon bombardment by a plasma.

The plasma may be formed from a fluorine-containing etchant gas for forming via holes for plugs and interconnects. The means for holding a semiconductor wafer securely on a platform is an electrostatic chucking device. The insert portion is substantially made of silicon. The body portion of the shadow ring has a cross-section of a rectangle with an upper inner corner of the rectangle missing to form a cavity for the insert portion to be intimately joined thereto. The body portion of the shadow ring can be made of a quartz material. The insert portion of the shadow ring may have a cross-section that is substantially a rectangle.

The present invention is further directed to a method for conducting an etching process in an edge chamber that is equipped with a shadow ring without generating contaminating oxygen gas which can be carried out by the operating steps of first providing a plasma generator in the etch chamber, then positioning a semiconductor wafer on an electrostatic chuck, then sealing the edge of the semiconductor wafer with a shadow ring such that an upper chamber and a lower chamber in the edge chamber are substantially isolated from each other, the shadow ring includes a body portion of a ring shape formed of a material of substantially silicon dioxide and an insert portion that is fabricated of a material which does not generate oxygen upon bombardment by a plasma cloud, and then generating a plasma cloud for carrying out the etching process.

The plasma cloud can be formed from a fluorine-containing etchant gas for forming via holes for plugs and interconnects. The insert portion of the shadow ring is made of substantially silicon. The body portion of the shadow ring may have a cross-section of a rectangle that has an upper inner corner of the rectangle missing forming a cavity for the insert member to be intimately joined thereto. The body portion of the shadow ring may be made of quartz. The insert portion of the shadow ring may have a cross-section that is substantially a rectangle.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a composite shadow ring for use in an etch chamber that does not generate contaminating oxygen gas when bombarded by a gas plasma, particularly a fluorine-containing plasma. The present invention further discloses a method for reducing tungsten plug loss during a via hole etching process by utilizing a non-quartz part, i.e., a non-quartz shadow ring, installed around the wafer edge.

Tungsten plug loss defect has frequently been observed at near the wafer edge in 0.5 μm logic devices. It was hypothesized that etchant gases such as $CF_4$, $CHF_3$ utilized, particularly in their plasma form, cause severe damage to any quartz material present. The quartz material, when attacked by a fluorine-containing plasma, releases oxygen gas. The oxygen gas, during a via etching process, then inhibits or attacks polymeric sidewall passivation layers in the via openings which is normally formed during an etching process by either a photoresist material or an etchant gas such as $CHF_3$. It is a unique discovery of the present invention that by introducing non-quartz parts, such as a shadow ring that is equipped with an insert portion immediately adjacent to a wafer surface made of a silicon material, the possibility of oxygen generation is greatly reduced or eliminated. A dense polymer deposition in the via opening to prevent lateral etch in a SOG layer is thus possible which leads to a great reduction in tungsten plug loss on a wafer surface particularly at near the peripheral edge of the wafer.

In a tungsten plug formation process, via openings can be first etched by a fluorine-containing etch chemistry. An adhesion promoter layer of TiN is then deposited in the via openings followed by a tungsten deposition typically by a chemical vapor deposition process. The tungsten layer is then etched back to form the individual tungsten plugs in the via openings. When lateral etch occurring in a SOG layer in a via opening is severe, an excessively large opening is formed which leads to a plug loss defect. There is evidence showing that the thicker the SOG layer deposited in a PEOX/SOG/PEOX sandwich structure, the more serious is the tungsten plug loss defect. Lateral etch in a thick SOG layer is hypothesized as the main cause for such plug loss. The excessive lateral etch occurring in a SOG layer is in turn caused by a poor polymeric passivation on the via sidewalls due to the presence of oxygen gas produced when the quartz shadow ring is bombarded by a fluorine-containing plasma.

Figure 1:
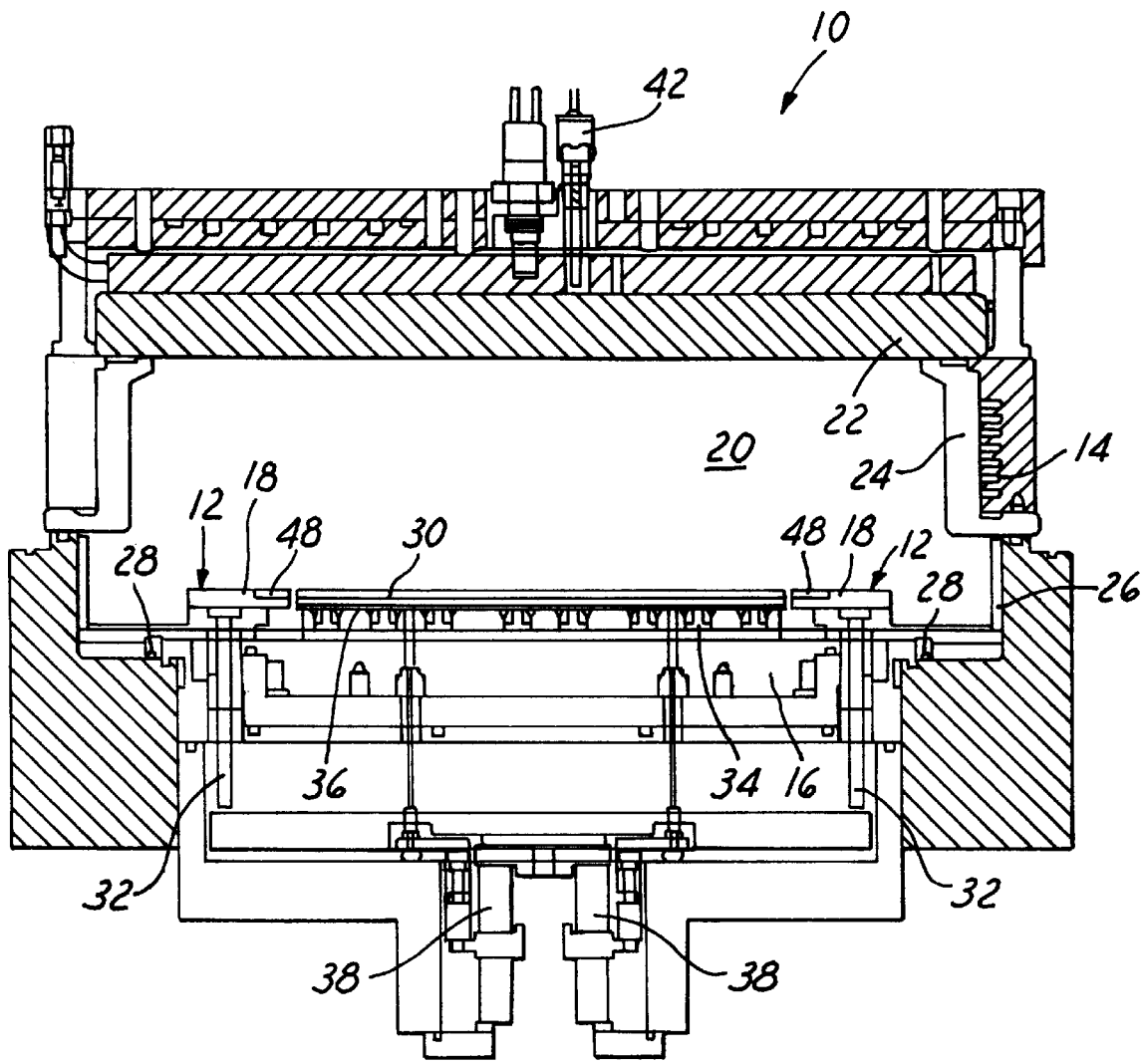
FIG. 1 is a cross-sectional view of a present invention vacuum chamber that has a composite shadow ring installed therein.

Referring initially to FIG. 1, wherein a present invention vacuum chamber 10 having a shadow ring 12 installed therein is shown. The vacuum chamber 10 is used for an etcher and is equipped with a coil antenna 14 as a plasma source and an electrostatic chuck 16. A plasma reaction chamber 20 is formed by a silicon ceiling block 22, a dome-shaped sidewall 24, a chamber wall liner 26 and the electrostatic chuck 16. The dome-shaped sidewall 24 and the chamber wall liner 26 are normally fabricated of a quartz material. The chamber wall liner 26 is equipped with an opening (not shown) for allowing the passage of a wafer paddle in loading and unloading wafers. The chamber wall liner 26 can be removed from the vacuum chamber 10 for cleaning.

A shadow ring 12 is positioned inside the plasma reaction chamber 20 which can be lifted in position by positioning pins 32. The positioning pins 32 lift the shadow ring 12 away from the wafer 30 when a wafer is being loaded to or unloaded from the electrostatic chuck 16. A multiplicity of cooling gas channels 34 is provided inside the electrostatic chuck 16 at near its top surface 36. A high heat conductivity gas such as helium can be circulated through the cooling gas channels 34 to provide a suitable gas pressure on the bottom side of wafer 30 for transferring heat away from wafer 30 to the water-cooled electrostatic chuck 16 during an etching process. The supply lines for the cooling gas to channel 34 are not shown. The electrostatic chuck 16 is aligned by an electrostatic chuck collar 38. The etching gas is fed into chamber 20 through gas inlet 28. A thermal coupler 42 is mounted in the silicon ceiling block 22 for controlling temperature.

Figure 1A:
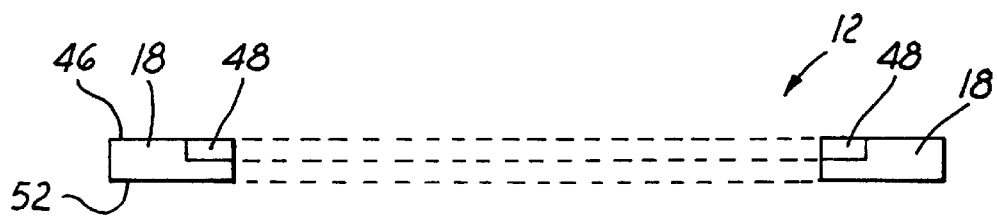
FIG. 1A is an enlarged, cross-sectional view of the present invention composite shadow ring constructed of a body portion and an insert portion.

An enlarged, cross-sectional view of the present invention shadow ring 12 is shown in FIG. 1A. The shadow ring 12 is constructed by two major parts, has a body portion 18 and an insert portion 48. The body portion has a ring shape and is made of a material that is substantially of silicon dioxide. The insert portion 48 is intimately joined to the body portion 18 by frictional engagement and is juxtaposed to a plasma cloud (not shown) formed in the etch chamber 20 when the shadow ring 12 is positioned around wafer 30. The insert portion 48 also has a ring shape and is concentric with the body portion 18. The insert portion 48 generally has a diameter that is smaller than a diameter of the body portion 18. The insert portion 48 can be fabricated of a material that does not generate oxygen upon bombardment by a plasma, particularly by a fluorine-containing plasma. The insert portion 18 can be engaged to the body portion 18 by any suitable means such as frictional engagement or any other mechanical means.

It should be noted that the configuration of the body portion 18 and the insert portion 48 of the shadow ring 12 is presented for illustration purpose only. The present invention novel shadow ring 12 may be constructed in any other suitable configuration as long as the surface area that is exposed and immediately adjacent to a wafer surface is fabricated of a material that does not generate oxygen upon bombardment by a plasma. Any such suitable materials may be utilized for fabricating the insert portion, i.e., it may be advantageously fabricated of a silicon material. The requirement for the material used in the insert portion are that it does not give out oxygen when attacked by an etchant plasma and it is resistant to high temperatures and hostile chemicals.

The configuration of the insert portion 18 may be such that it constitutes an inner concentric ring while the body portion 18 constitutes an outer concentric ring. In other words, the insert portion 18 is present between a top surface 46 and a bottom surface 52 of the shadow ring 12. This configuration is not shown in FIG. 1A. The key requirement for the present invention insert ring is that it presents a surface which is immediately adjacent to a wafer surface and is fabricated of a material that is inert to an etchant plasma. When no oxygen gas is produced by the shadow ring, i.e., a quartz damage by the plasma is avoided, a dense polymeric sidewall passivation layer can be deposited in the via holes. As a result, a reduction in lateral etch in the SOG layer is realized which directly leads to a reduction or elimination of the tungsten plug loss defect.

Figure 2:
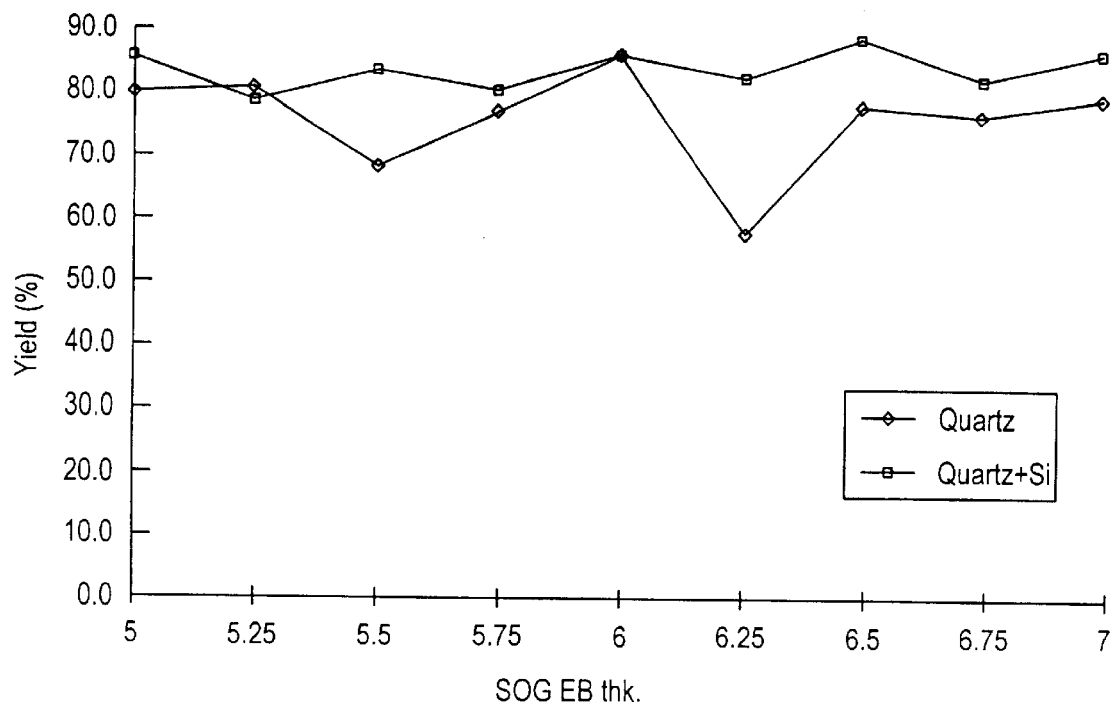
FIG. 2 is a graph illustrating data of improved yield obtained in an etch chamber that is equipped with the present invention shadow ring when compared to yield obtained in an etch chamber equipped with a conventional shadow ring.

The advantages achieved by the present invention novel apparatus and method are shown in FIG. 2. The yield (in percentages) from an etch chamber equipped with a conventional quartz shadow ring and the yield from an etch chamber equipped with the present invention composite quartz/silicon shadow ring are shown. The yield data are plotted against the SOG layer etch back thickness. It is seen that at various SOG layer etch back thicknesses, the yield obtained from a vacuum chamber equipped with the composite shadow ring remains essentially constant. This is in contrast to a large variation in the yield data obtained from a conventional etch chamber that is not equipped with the present invention composite shadow ring.

The present invention novel apparatus of a composite shadow ring for use in an etch chamber and a method for using such novel apparatus are amply demonstrated in the above descriptions and in the appended drawings of FIGS. 1, 1A and 2. It should be noted that while an etch chamber utilizing a fluorine-containing gas chemistry is used in the illustration, the present invention novel apparatus can be used suitably in any etch chambers that utilizes an etch chemistry which causes damage to a shadow ring and produces an undesirable contaminating gas from the shadow ring.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

We claim:

1. A composite shadow ring for use in an etch chamber that does not generate oxygen gas when bombarded by a gas plasma comprising:
    a body portion of a ring shape made of a material that is substantially silicon dioxide, and
    an insert portion intimately joined to said body portion and being adjacent to a plasma in said etch chamber when said shadow ring is positioned juxtaposed to a wafer, said insert portion having a ring shape being concentric with said body portion and generally having a diameter smaller than a diameter of said body portion, said insert portion being fabricated of a material that does not generate oxygen upon bombardment by said plasma.

2. A composite shadow ring for use in an etch chamber that does not generate contaminating oxygen gas when bombarded by a gas plasma according to claim 1, wherein said insert portion being made of substantially silicon.

3. A composite shadow ring for use in an etch chamber that does not generate contaminating oxygen gas when bombarded by a gas plasma according to claim 1, wherein said insert portion having a cross-section of a rectangle.

4. A composite shadow ring for use in an etch chamber that does not generate contaminating oxygen gas when bombarded by a gas plasma according to claim 1, wherein said body portion generally having a cross-section of a rectangle having an upper corner of said rectangle missing forming a cavity for said insert member to be intimately joined therein.

5. A composite shadow ring for use in an etch chamber that does not generate contaminating oxygen gas when bombarded by a gas plasma according to claim 1, wherein said body portion being made of a high temperature resistant ceramic material.

6. A composite shadow ring for use in an etch chamber that does not generate contaminating oxygen gas when bombarded by a gas plasma according to claim 1, wherein said body portion being made of quartz.

7. A composite shadow ring for use in an etch chamber that does not generate contaminating oxygen gas when bombarded by a gas plasma according to claim 1, wherein said insert portion does not generate oxygen when bombarded by a fluorine-containing gas plasma.

8. An etch chamber for a semiconductor wafer comprising:
    means for generating a gas plasma of an etchant gas,
    means for holding a semiconductor wafer securely on a platform, and
    a shadow ring for engaging an edge portion of said wafer and for forming a seal between an upper chamber and a lower chamber separated by said wafer, said shadow ring comprises:
        a body portion of a ring shape formed of a material of substantially silicon dioxide, and
        an insert portion intimately joined to said body portion and being juxtaposed to a plasma in said etch chamber when said shadow ring is positioned on a wafer, said insert portion having a ring shape being concentric with said body portion and generally having a diameter smaller than a diameter of said body portion, said insert portion being fabricated of a material that does not generate oxygen upon bombardment by said plasma.

9. An etch chamber for a semiconductor wafer according to claim 8, wherein said gas plasma is formed from a fluorine-containing etchant gas for forming via holes for plugs and interconnects on said wafer.

10. An etch chamber for a semiconductor wafer according to claim 8, wherein said means for holding a semiconductor wafer securely on a platform is an electrostatic chucking device.

11. An etch chamber for a semiconductor wafer according to claim 8, wherein said insert portion being made of substantially silicon.

12. An etch chamber for a semiconductor wafer according to claim 8, wherein said body portion of said shadow ring having a cross-section of a rectangle having an upper corner of said rectangle missing forming a cavity for said insert member to be intimately joined therein.

13. An etch chamber for a semiconductor wafer according to claim 8, wherein said body portion of said shadow ring being made of quartz.

14. An etch chamber for a semiconductor wafer according to claim 8, wherein said insert portion of said shadow ring has a cross-section of substantially a rectangle.

15. A method for conducting an etching process in an etch chamber equipped with a shadow ring without generating contaminating oxygen gas comprising the steps of:

providing a plasma generator in said etch chamber, positioning a semiconductor wafer on an electrostatic chuck, sealing the edge of said semiconductor wafer with a shadow ring such that an upper chamber and a lower chamber in said etch chamber are substantially isolated from each other, said shadow ring comprises a body portion of a ring shape formed of a material of substantially silicon dioxide and an insert portion being fabricated of a material that does not generate oxygen upon bombardment by said plasma, and generating a plasma and carrying out an etching process.

16. A method for conducting an etching process in an etch chamber equipped with a shadow ring without generating contaminating oxygen gas according to claim 15, wherein said plasma is formed from a fluorine-containing etchant gas for forming via holes for plugs and interconnects on said wafer.

17. A method for conducting an etching process in an etch chamber equipped with a shadow ring without generating contaminating oxygen gas according to claim 15, wherein said insert portion being made of substantially silicon.

18. A method for conducting an etching process in an etch chamber equipped with a shadow ring without generating contaminating oxygen gas according to claim 15, wherein said body portion of said shadow ring having a cross-section of a rectangle having an upper corner of said rectangle missing forming a cavity for said insert member to be intimately joined therein.

19. A method for conducting an etching process in an etch chamber equipped with a shadow ring without generating contaminating oxygen gas according to claim 15, wherein said body portion of said shadow ring being made of quartz.

20. A method for conducting an etching process in an etch chamber equipped with a shadow ring without generating contaminating oxygen gas according to claim 15, wherein said insert portion of said shadow ring has a cross-section of substantially a rectangle.

* * * * *